United States Patent
Kumar

(10) Patent No.: US 10,842,022 B2
(45) Date of Patent: Nov. 17, 2020

(54) MULTILAYERED FLEXIBLE ELECTRONICS PLATFORM

(71) Applicant: Rajan Kumar, La Jolla, CA (US)

(72) Inventor: Rajan Kumar, La Jolla, CA (US)

(73) Assignee: OCELLA INC, Newberry, IN (US)

( * ) Notice: Subject to any disclaimer, the term of this patent is extended or adjusted under 35 U.S.C. 154(b) by 136 days.

(21) Appl. No.: 16/133,691

(22) Filed: Sep. 17, 2018

(65) Prior Publication Data

US 2019/0090350 A1 Mar. 21, 2019

Related U.S. Application Data

(60) Provisional application No. 62/559,395, filed on Sep. 15, 2017.

(51) Int. Cl.
| | |
|---|---|
| *H05K 1/18* | (2006.01) |
| *H05K 1/02* | (2006.01) |
| *H05K 1/03* | (2006.01) |
| *H05K 1/11* | (2006.01) |
| *H05K 3/46* | (2006.01) |

(Continued)

(52) U.S. Cl.
CPC .......... *H05K 1/189* (2013.01); *H01M 2/0275* (2013.01); *H01M 10/425* (2013.01); *H02J 7/0042* (2013.01); *H02J 7/025* (2013.01); *H02J 50/10* (2016.02); *H02J 50/40* (2016.02); *H05K 1/028* (2013.01); *H05K 1/0274* (2013.01); *H05K 1/0393* (2013.01); *H05K 1/118* (2013.01); *H05K 3/4644* (2013.01); *H05K 3/4691* (2013.01); *B29C 65/72* (2013.01); *B32B 2307/202* (2013.01); *G06F 1/163* (2013.01); *H01M 6/40* (2013.01); *H02J 7/35* (2013.01); *H05K 1/16* (2013.01); *H05K 3/284* (2013.01); *H05K 2201/05* (2013.01); *H05K 2201/09* (2013.01); *H05K 2201/10098* (2013.01)

(58) Field of Classification Search
CPC .. H05K 1/00; H05K 1/02; H05K 1/04; H05K 1/14; H05K 1/141; A61N 1/30; A61F 7/00; F25B 21/04; G01R 1/14; G01R 27/26
USPC ........................ 361/749, 736, 807–810, 816; 174/254–260, 520–525, 350
See application file for complete search history.

(56) References Cited

U.S. PATENT DOCUMENTS

| | | | | |
|---|---|---|---|---|
| 5,639,989 | A * | 6/1997 | Higgins, III .......... | H01L 23/552 174/386 |
| 2007/0160789 | A1* | 7/2007 | Merical ..................... | B32B 7/02 428/35.7 |

(Continued)

*Primary Examiner* — Tuan T Dinh

(57) ABSTRACT

A multilayer flexible electronics platform is an apparatus that allows modular thin-film electronics to be integrated into everyday flexible, flat objects such as pieces of clothing, material coatings, or wearable devices. The apparatus includes a flexible water-impermeable envelop, a flexible power-source layer, a flexible printed circuit board (PCB) layer, and a flexible accessory-interfacing layer. The flexible accessory-interfacing layer allows those modular thin-film electronics to be electronically and electrically attached to the apparatus. The flexible PCB layer allows the apparatus to control and manage those modular thin-film electronics. The flexible power-source layer is used to provide electrical power to those modular thin-film electronics. The flexible water-impermeable envelop protectively encloses those modular thin-film electronics and the aforementioned functional layers of the apparatus.

19 Claims, 4 Drawing Sheets

(51) Int. Cl.
*H02J 7/02* (2016.01)
*H01M 2/02* (2006.01)
*H02J 50/10* (2016.01)
*H01M 10/42* (2006.01)
*H02J 7/00* (2006.01)
*H02J 50/40* (2016.01)
H02J 7/35 (2006.01)
B29C 65/72 (2006.01)
H05K 1/16 (2006.01)
G06F 1/16 (2006.01)
H05K 3/28 (2006.01)
H01M 6/40 (2006.01)

(56) References Cited

U.S. PATENT DOCUMENTS

| | | | |
|---|---|---|---|
| 2009/0048556 A1* | 2/2009 | Durand | A61K 9/0009 604/20 |
| 2010/0228516 A1* | 9/2010 | Hinterlong | A61B 5/103 702/139 |
| 2013/0153459 A1* | 6/2013 | Yoshita | B65D 75/326 206/530 |
| 2014/0084045 A1 | 3/2014 | Yang et al. | |
| 2014/0268780 A1* | 9/2014 | Wang | F21V 19/003 362/249.06 |
| 2015/0373831 A1 | 12/2015 | Rogers et al. | |
| 2016/0178251 A1* | 6/2016 | Johnson | A41D 27/06 62/3.5 |
| 2018/0146545 A1 | 5/2018 | Wang et al. | |

* cited by examiner

MULTILAYERED FLEXIBLE ELECTRONICS PLATFORM

The current application claims a priority to the U.S. Provisional Patent application Ser. No. 62/559,395 filed on Sep. 15, 2017. The current application is filed on Sep. 17, 2018 while Sep. 15, 2018 was on a weekend.

FIELD OF THE INVENTION

The present invention relates generally to a thin-film electronic device. More specifically, the present invention relates to a flexible device that uses layers of thin-film electronics to harvest energy from the environment, surroundings, or body and/or to form a device capable of powering any number of integrated electrical modules.

BACKGROUND OF THE INVENTION

The allure of wearable technology has been hanging over consumer electronics for decades. This technology promises to deliver inconspicuous devices that are integrated into commonplace items such as clothing and wearables. While integrating electronic components into rigid devices, such as watches or glasses, is a relatively straight forward process, integrating electronics into clothing has proved challenging for scientists and engineers. The challenges stem from two main obstacles. Namely, creating truly flexible electronic devices, and unobtrusively powering such devices.

The present invention, the multilayered flexible electronics platform, addresses these challenges by using thin-film electronics to create flexible electronic systems. The present invention leverages the capabilities of circuits, electronics, and batteries to create as a flexible sheet of material that functions as a self-sufficient electronic system. Specifically, the present invention makes use of a battery layer to store the electrical charge required to power a flexible layer of electronic devices. This invention may also make use of an energy harvesting layer to generate power. The present invention encases all of the flexible electronic components in a water-impermeable casing or membrane that protects the components from hazards in the external environment. This construction enables the present invention to be integrated into clothing and can be used to cover various other surfaces.

DETAILED DESCRIPTION OF THE INVENTION

All illustrations of the drawings are for the purpose of describing selected versions of the present invention and are not intended to limit the scope of the present invention.

Figure 1:
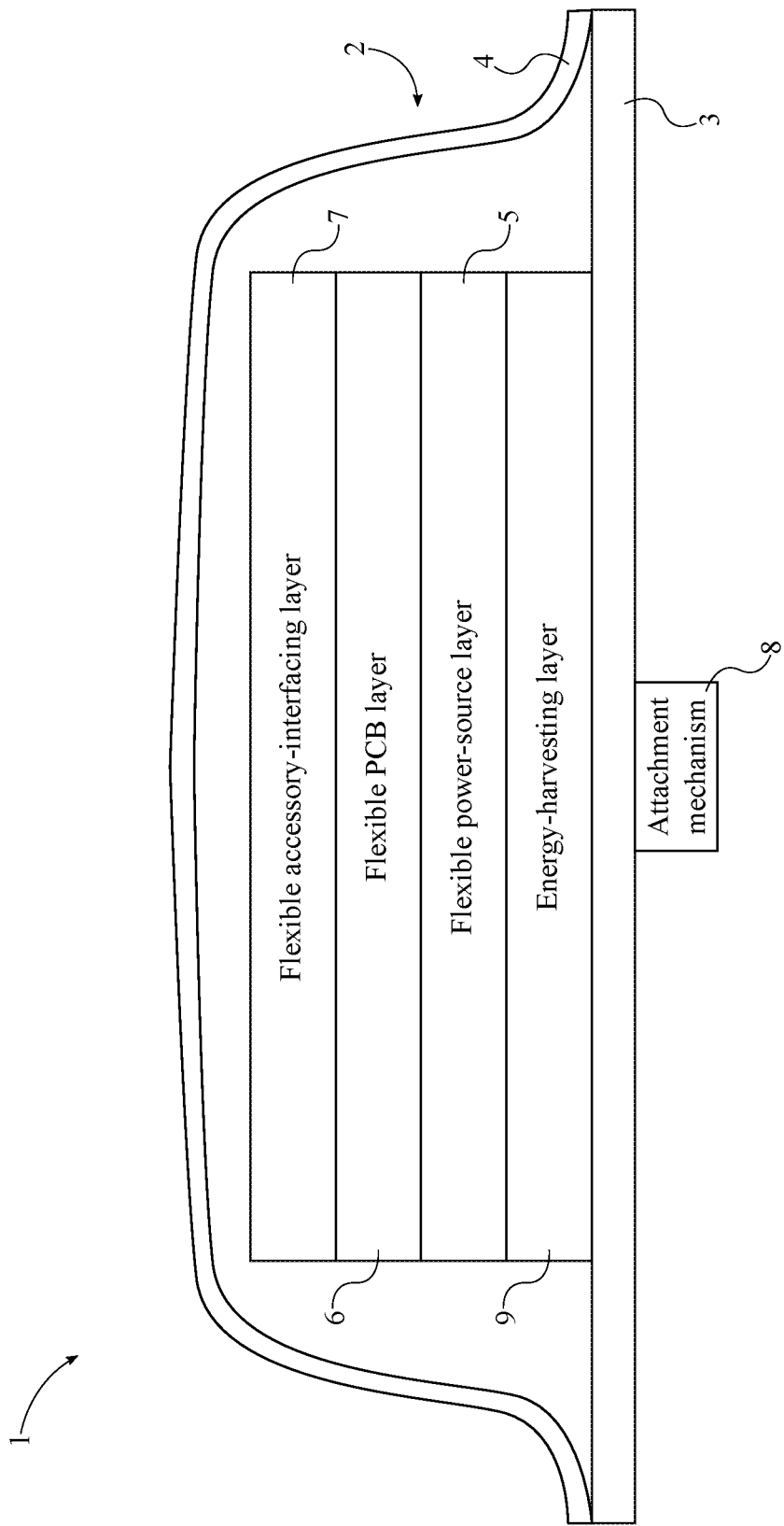
FIG. 1 is a schematic diagram of the present invention.

The present invention is a multilayer flexible electronics platform that integrates thin-film electronic devices into a flexible membrane. The present invention can be used in a wide variety of applications, which includes, but not limited to, textiles, material coatings, and wearable devices. As can be seen in FIG. 1, the present invention comprises at least one functional unit 1, each of which comprises a flexible water-impermeable envelop 2, a flexible power-source layer 5, a flexible printed circuit board (PCB) layer 6, and a flexible accessory-interfacing layer 7. The flexible water-impermeable envelop 2 is used to seal the other electronic components of the present invention in a protective enclosure. The flexible water-impermeable envelop 2 is preferably made of rubber, silicone, polyurethane, or some other similar material. The flexible power-source layer 5 is used to store energy and to readily power the other electronic components of the present invention. The flexible power-source layer 5 is preferably a flexible, elastic, flat battery that is a printed thin-film device. The flexible power-source layer 5 can alternatively be a supercapacitor or a hybrid battery/supercapacitor. The flexible PCB layer 6 regulates the power distribution from the flexible power-source layer 5 and manages commands and other pieces of data that are exchanged between the flexible PCB layer 6 and the flexible accessory-interfacing layer 7. The flexible accessory-interfacing layer 7 allows for other modular electronic devices to be electrically and electronically attached to the present invention. These modular electronic devices include, but is not limited to, sensors, light emitting diodes (LEDs), solar panels, display devices, speakers, and user-interface devices.

The general configuration of the aforementioned components allows the present invention to efficiently and effectively maintain a flat shape so that the present invention can be easily integrated into a fabric or other flexible flat apparatus. The flexible power-source layer 5, the flexible PCB layer 6, and the flexible accessory-interfacing layer 7 are stackably positioned amongst each other, which allows for the overall flat shape of the present invention. For example, if the present invention is integrated into a piece of clothing, then the overall flat shape prevents the present invention from becoming obtrusive and uncomfortable on the piece of clothing. Moreover, the flexible power-source layer 5, the flexible PCB layer 6, and the flexible accessory-interfacing layer 7 are positioned within the flexible water-impermeable envelop 2 so that these electronic components are protected from water and other kinds of damage. Again, for example, if the present invention is integrated into a piece of clothing, then the piece of clothing could be washed in water or worn in the rain without fear of damaging the present invention. In addition, the flexible PCB layer 6 is electronically connected to the flexible power-source layer 5 and the flexible accessory-interfacing layer 7 in order to communicate digital signals between the flexible PCB layer 6, the flexible power-source layer 5, and the flexible accessory-interfacing layer 7. Consequently, the flexible PCB layer 6 is also able to communicate digital signals with any modular electronic device that have been attached to the flexible accessory-interfacing layer 7. Furthermore, the flexible power-source layer 5 is electrically connected to the flexible PCB layer 6 and the flexible accessory-interfacing layer 7, which allows the flexible power-source layer 5 to readily deliver power to the flexible PCB layer 6, the flexible accessory-interfacing layer 7, or any modular electronic devices that are attached to the flexible accessory-interfacing layer 7.

The present invention is a retrofit device that is designed to be attached or adhered to another larger object. Thus, each of the at least one functional unit 1 may further comprise an attachment mechanism 8, which can be, but is not limited to, a combination of stitching and cloth, an adhesive patch, an adhesive film, a hook-and-loop fastener, a mechanical fastener, a wristband, or a headband. The attachment mechanism 8 is externally mounted to the flexible water-impermeable envelop 2 so that the attachment mechanism 8 can be readily used to attach the flexible water-impermeable envelop 2 to the other larger object.

In order for the present invention to maintain the overall flat shape, the at least one functional unit 1 may further comprise a base liner 3 and a sealant layer 4. The base liner 3 is used as a substrate to properly position the other components of the present invention. The base liner 3 is preferably used to integrate the present invention into articles of clothing or to attach the present invention onto the surface of external devices. The sealant layer 4 is used to enclose the other components of the present invention upon the base liner 3. Thus, the flexible power-source layer 5, the flexible PCB layer 6, and the flexible accessory-interfacing layer 7 are positioned in between the base liner 3 and the sealant layer 4. Moreover, the base liner 3 and the sealant layer 4 are perimetrically connected to each other, which defines the internal space of the flexible water-impermeable envelop 2 that retains the flexible power-source layer 5, the flexible PCB layer 6, and the flexible accessory-interfacing layer 7.

The present invention may also be configured to gather energy from its surrounding environment, which allows the present invention to be a self-sustaining system without an external power source. Thus, each of the at least one functional unit 1 may further comprise an energy-harvesting layer 9, which is made of any material that can convert a changing physical property of the surrounding environment into an electrical current. In addition, the energy-harvesting layer 9 is stackably positioned amongst the flexible power-source layer 5, the flexible PCB layer 6, and the flexible accessory-interfacing layer 7 and is positioned within the flexible water-impermeable envelop 2. This arrangement allows for a change in a specific physical property of the present invention to potentially produce an electrical current with the energy-harvesting layer 9. Consequently, the energy-harvesting layer 9 is electrically connected to the flexible power-source layer 5 so that the energy-harvesting layer 9 is able to recharge the flexible power-source layer 5.

The energy-harvesting layer 9 can be applied in a variety of different embodiments. One embodiment of the energy-harvesting layer 9 is a quantity of photoelectric material that is distributed throughout the flexible water-impermeable envelop 2. For this embodiment, the flexible water-impermeable envelop 2 would need to be transparent so that light passing through the water-impermeable envelop could be converted into an electric current by the quantity of photoelectric material. Another embodiment of the energy-harvesting layer 9 is a quantity of piezoelectric material (e.g. piezoelectric foam) that is distributed throughout the flexible water-impermeable envelop 2. For this embodiment, the flexible water-impermeable envelop 2 would need to be crinkled, scrunched, or moved in some mechanically stressful manner in order to generate an electric current with the quantity of piezoelectric material. Another embodiment of the energy-harvesting layer 9 is a quantity of pyroelectric material that is distributed throughout the flexible water-impermeable envelop 2. For the embodiment, the flexible water-impermeable envelop 2 would need to be thermally conductive so that heat passing through the water-impermeable envelop could be converted into an electric current by the quantity of pyroelectric material. Another embodiment of the energy-harvesting layer 9 is a quantity of triboelectric material that is distributed throughout the flexible water-impermeable envelop 2. For this embodiment, the flexible water-impermeable envelop 2 would need to be moved in some frictional manner in order to generate an electric current with the quantity of triboelectric material.

Figure 3:
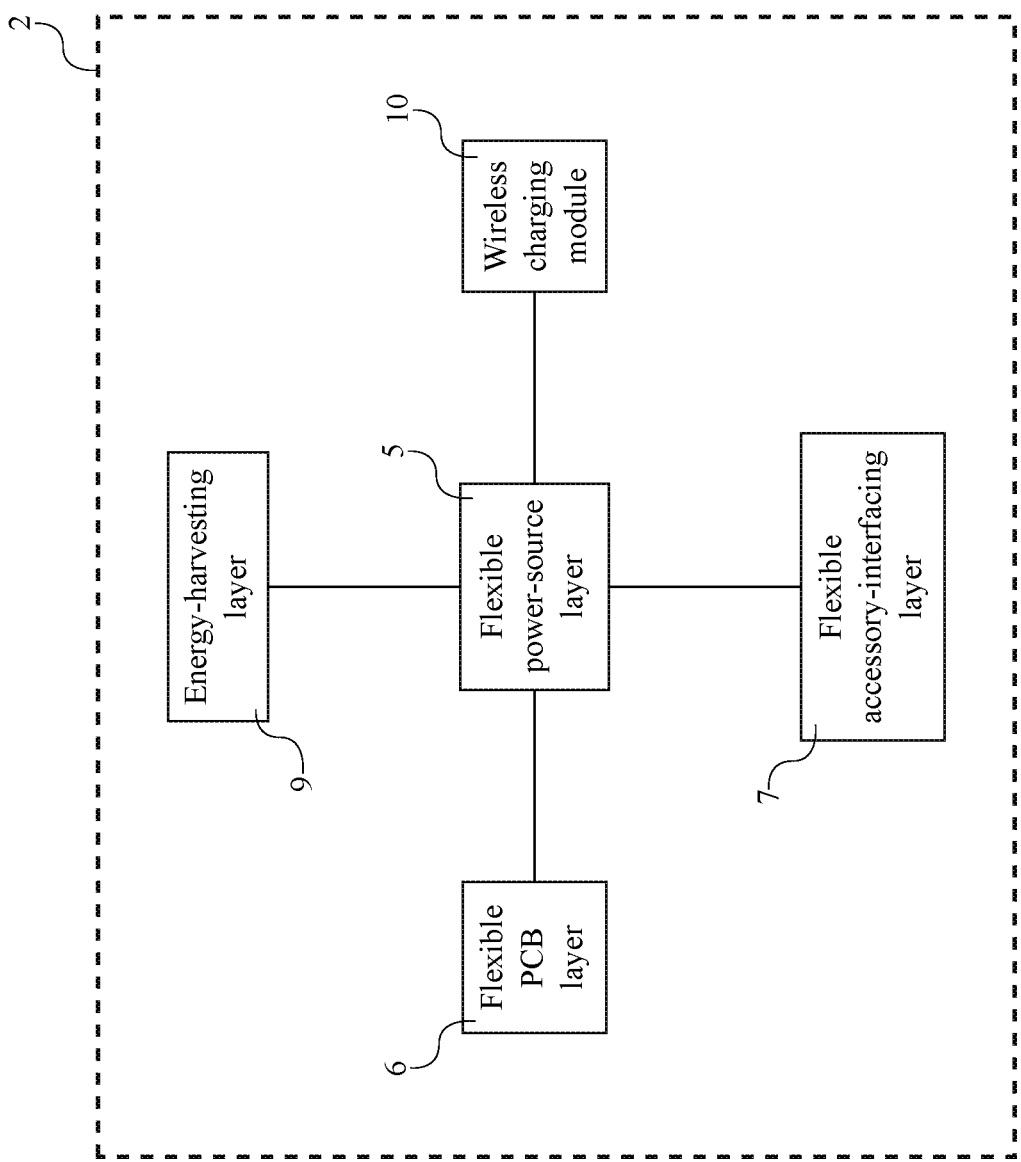
FIG. 3 is a schematic diagram of the electrical connections within the present invention.

As can be seen in FIG. 3, the present invention may also be configured to gather energy from a conventional wireless charging pad. Thus, each of the at least one functional unit 1 may further comprise a wireless charging module 10, which preferably is an induction coil. The wireless charging module 10 is positioned within the flexible water-impermeable envelop 2 in order to properly secure the wireless charging module 10 to the present invention. The wireless charging module 10 is electrically connected to the flexible power-source layer 5 so that the wireless charging module 10 is able to recharge the flexible power-source layer 5.

Figure 2:
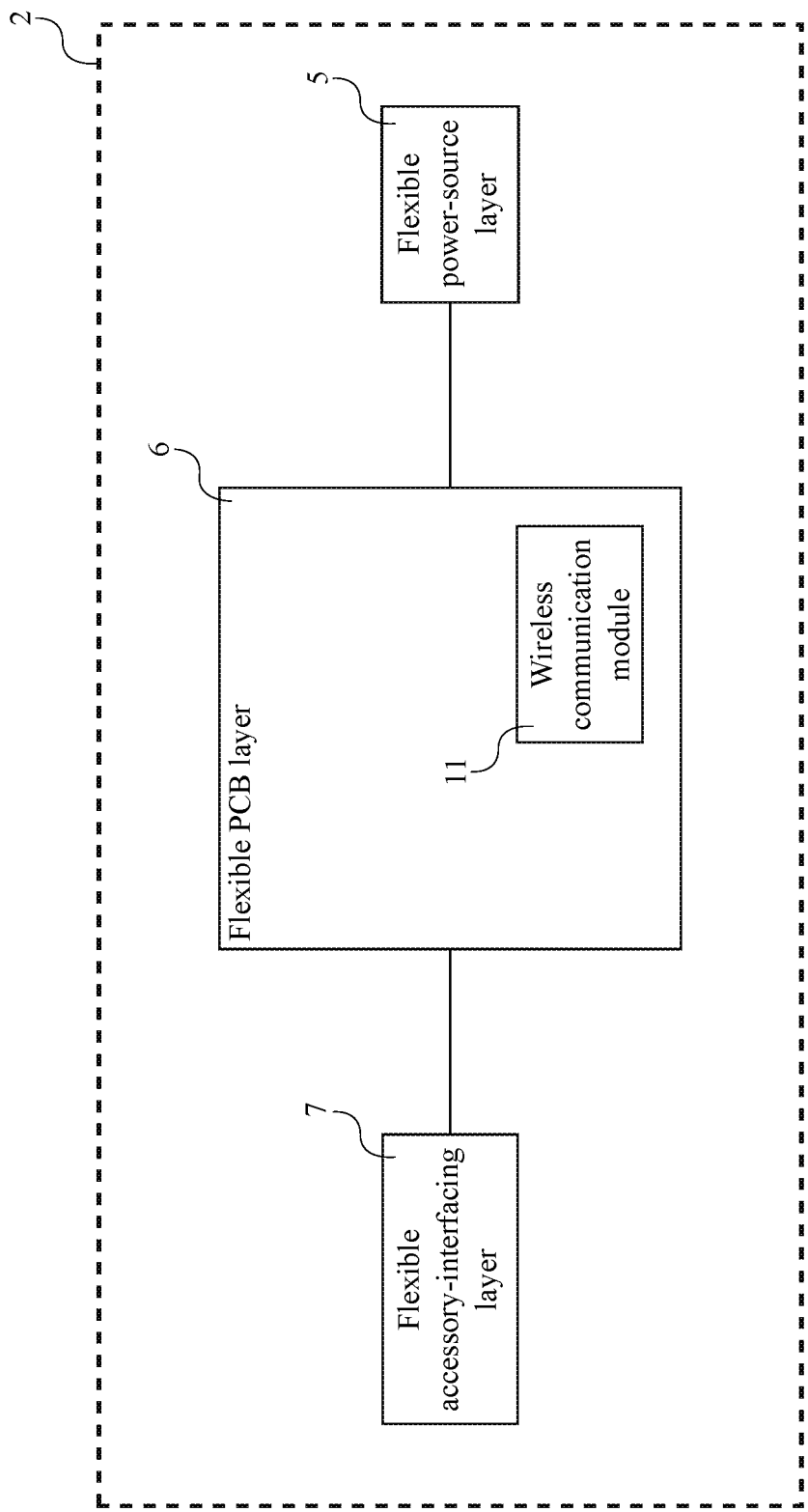
FIG. 2 is a schematic diagram of the electronic connections within the present invention.

As can be seen in FIG. 2, the present invention may also be configured to wirelessly communicate data with an external computing device. Thus, each of the at least one functional unit 1 may further comprise a wireless communication module 11, which can be, but is not limited to, a module facilitating a personal area network (e.g. Bluetooth), a module facilitating near field communication (NFC), or a module facilitating radio-frequency identification (RFID). The wireless communication module 11 is electronically integrated into the flexible PCB layer 6 so that the flexible PCB layer 6 is readily able to process incoming data from and/or outgoing data to the wireless communication module 11.

Figure 4:
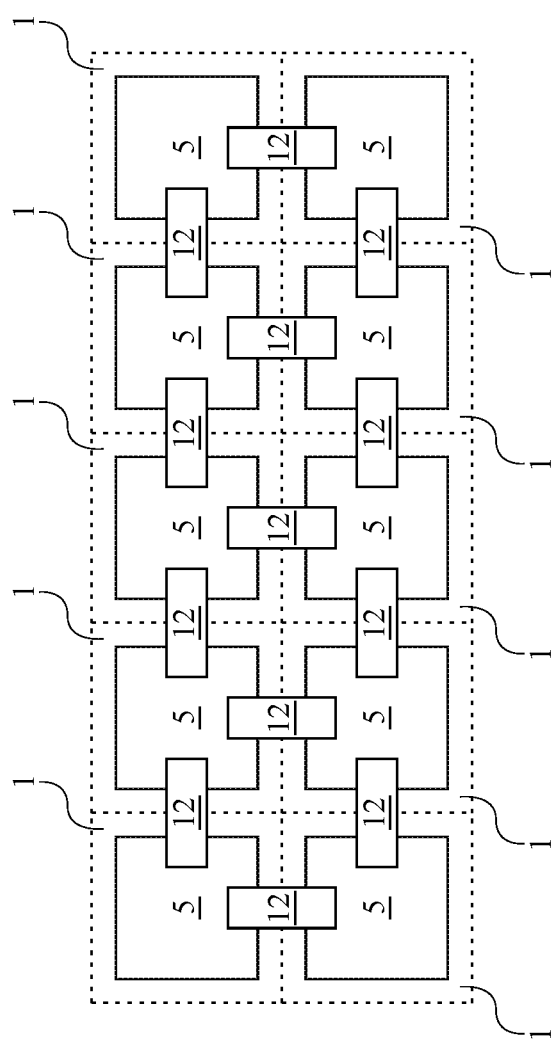
FIG. 4 is a schematic diagram of an embodiment of the present invention, wherein the embodiment is a multi-sectioned foldable sheet.

As can be seen in FIG. 4, the present invention may also be configured as a multi-sectioned foldable sheet. Thus, the at least one functional unit 1 needs to be a plurality of functional units 1, and the present invention needs to further comprise a plurality of conductive strips 12. The plurality of functional units 1 is arranged into a grid configuration so that the flexible water-impermeable envelop 2 of each of the plurality of functional units 1 can be foldably connected amongst each other. This allows the present invention to be configured into a multi-sectioned foldable sheet. Moreover, the flexible power-source layer 5 of each of the plurality of functional units 1 is electrically connected amongst each other by a corresponding strip from the plurality of conductive strips 12, which allows each of the plurality of functional units 1 to share power amongst each other.

One use of the present invention is designed to be used to manufacture smart clothing that has the appearance of traditional textiles and the functionality of a piece of wearable technology. As such, the base liner 3 and the sealant layer 4 form a water-impermeable membrane around the flexible power-source layer 5, the flexible PCB layer 6, the energy-harvesting layer 9, and/or the flexible accessory-interfacing layer 7. This configuration enables the present invention to be incorporated into a machine washable garment.

Another use of the present invention is as a thermally adaptive textile that is integrated into the base liner 3 and the sealant layer 4. The present invention would be able to change configuration in response to the user's body heat. This enables the present invention to expand when cooled and contract when heated. This functionality enables the present invention to moderate the user's body temperature.

The present invention can be implemented in a variety of other uses, which include, but is not limited to, the following. Another use of the present invention is as a foldable battery-solar pack, which is an energy storage or harvesting device applied on a flat sheet can be folded into multiple layers and reducing significant area. Another use of the present invention is as a weight-distributed flexible electronic device with a battery that can attach, slide, insert, zip, fasten, or snap onto a garment. Another use of the present invention is as a flexible battery circuitry mounted to a wearable band. Another use of the present invention is as a band integrated with a smart wearable device either connected physically or wirelessly. Another use of the present invention is as a clothing container, drawer, or closest with wireless charging and a flexible battery apparatus. Another use of the present invention is as a periphery garment of battery mount to textile that communicates to a smart phone or network. Another use of the present invention is as an apparatus that monitors a person's mental health, a person's physical health, a person's wound, a person's sleeping habits. Another use of the present invention is as a garment of drug delivery and monitoring. Another use of the present invention is as a flexible circuit with battery and communications for impact measurement on a head mounted item (e.g. hat, helmet, headband, sweatband). The present invention can also be designed to be dust resistant.

Although the invention has been explained in relation to its preferred embodiment, it is to be understood that many other possible modifications and variations can be made without departing from the spirit and scope of the invention as hereinafter claimed.

What is claimed is:

1. A multilayered flexible electronics platform comprises:
   at least one functional unit;
   the at least one functional unit comprises a flexible water-impermeable envelop, a flexible power-source layer, a flexible printed circuit board (PCB) layer, and a flexible accessory-interfacing layer;
   the flexible power-source layer, the flexible PCB layer, and the flexible accessory-interfacing layer being stackably positioned amongst each other;
   the flexible power-source layer, the flexible PCB layer, and the flexible accessory-interfacing layer being positioned within the flexible water-impermeable envelop;
   the flexible PCB layer being electronically connected to the flexible power-source layer and the flexible accessory-interfacing layer;
   the flexible power-source layer being electrically connected to the flexible PCB layer and the flexible accessory-interfacing layer;
   a plurality of conductive strips;
   the at least one functional unit being a plurality of functional units;
   the plurality of functional units being arranged into a grid configuration;
   the flexible water-impermeable envelop of each of the plurality of functional units being foldably connected amongst each other; and
   the flexible power-source layer of each of the plurality of functional units being electrically connected amongst each other by a corresponding strip from the plurality of conductive strips.

2. The multilayered flexible electronics platform as claimed in claim 1 comprises:
   the at least one functional unit further comprises an attachment mechanism; and
   the attachment mechanism being externally mounted to the flexible water-impermeable envelop.

3. The multilayered flexible electronics platform as claimed in claim 1 comprises:
   the flexible water-impermeable envelop comprises a base liner and a sealant layer;
   the flexible power-source layer, the flexible PCB layer, and the flexible accessory-interfacing layer being positioned in between the base liner and the sealant layer; and
   the base liner and the sealant layer being perimetrically connected to each other.

4. The multilayered flexible electronics platform as claimed in claim 1 comprises:
   the at least one functional unit further comprises an energy-harvesting layer;
   the energy-harvesting layer being stackably positioned amongst the flexible power-source layer, the flexible PCB layer, and the flexible accessory-interfacing layer;
   the energy-harvesting layer being positioned within the flexible water-impermeable envelop; and
   the energy-harvesting layer being electrically connected to the flexible power-source layer.

5. The multilayered flexible electronics platform as claimed in claim 1 comprises:
   a wireless charging module;
   the wireless charging module being positioned within the flexible water-impermeable envelop; and
   the wireless charging module being electrically connected to the flexible power-source layer.

6. The multilayered flexible electronics platform as claimed in claim 1 comprises:
   a wireless communication module; and
   the wireless communication module being electronically integrated into the flexible PCB layer.

7. The multilayered flexible electronics platform as claimed in claim 4 comprises:
   the energy-harvesting layer being a quantity of photoelectric material;
   the flexible water-impermeable envelop being transparent; and
   the quantity of photoelectric material being distributed throughout the flexible water-impermeable envelop.

8. The multilayered flexible electronics platform as claimed in claim 4 comprises:
   the energy-harvesting layer being a quantity of piezoelectric material; and
   the quantity of piezoelectric material being distributed throughout the flexible water-impermeable envelop.

9. The multilayered flexible electronics platform as claimed in claim 4 comprises:
   the energy-harvesting layer being a quantity of pyroelectric material;
   the flexible water-impermeable envelop being thermally conductive; and
   the quantity of pyroelectric material being distributed throughout the flexible water-impermeable envelop.

10. The multilayered flexible electronics platform as claimed in claim 4 comprises:
    the energy-harvesting layer being a quantity of triboelectric material; and
    the quantity of triboelectric material being distributed throughout the flexible water-impermeable envelop.

11. A multilayered flexible electronics platform comprises:
    at least one functional unit;
    the at least one functional unit comprises a flexible water-impermeable envelop, a flexible power-source layer, a flexible printed circuit board (PCB) layer, a flexible accessory-interfacing layer, an attachment mechanism, and an energy-harvesting layer;

the flexible power-source layer, the flexible PCB layer, and the flexible accessory-interfacing layer being stackably positioned amongst each other;

the flexible power-source layer, the flexible PCB layer, and the flexible accessory-interfacing layer being positioned within the flexible water-impermeable envelop;

the flexible PCB layer being electronically connected to the flexible power-source layer and the flexible accessory-interfacing layer;

the flexible power-source layer being electrically connected to the flexible PCB layer and the flexible accessory-interfacing layer;

the attachment mechanism being externally mounted to the flexible water-impermeable envelop;

the energy-harvesting layer being stackably positioned amongst the flexible power-source layer, the flexible PCB layer, and the flexible accessory-interfacing layer;

the energy-harvesting layer being positioned within the flexible water-impermeable envelop; and the energy-harvesting layer being electrically connected to the flexible power-source layer.

12. The multilayered flexible electronics platform as claimed in claim 11 comprises:

the flexible water-impermeable envelop comprises a base liner and a sealant layer;

the flexible power-source layer, the flexible PCB layer, and the flexible accessory-interfacing layer being positioned in between the base liner and the sealant layer; and the base liner and the sealant layer being perimetrically connected to each other.

13. The multilayered flexible electronics platform as claimed in claim 11 comprises:

the energy-harvesting layer being a quantity of photoelectric material;

the flexible water-impermeable envelop being transparent; and the quantity of photoelectric material being distributed throughout the flexible water-impermeable envelop.

14. The multilayered flexible electronics platform as claimed in claim 11 comprises:

the energy-harvesting layer being a quantity of piezoelectric material; and the quantity of piezoelectric material being distributed throughout the flexible water-impermeable envelop.

15. The multilayered flexible electronics platform as claimed in claim 11 comprises:

the energy-harvesting layer being a quantity of pyroelectric material;

the flexible water-impermeable envelop being thermally conductive; and the quantity of pyroelectric material being distributed throughout the flexible water-impermeable envelop.

16. The multilayered flexible electronics platform as claimed in claim 11 comprises:

the energy-harvesting layer being a quantity of triboelectric material; and the quantity of triboelectric material being distributed throughout the flexible water-impermeable envelop.

17. The multilayered flexible electronics platform as claimed in claim 11 comprises:

a wireless charging module;

the wireless charging module being positioned within the flexible water-impermeable envelop; and the wireless charging module being electrically connected to the flexible power-source layer.

18. The multilayered flexible electronics platform as claimed in claim 11 comprises:

a wireless communication module; and the wireless communication module being electronically integrated into the flexible PCB layer.

19. The multilayered flexible electronics platform as claimed in claim 11 comprises:

a plurality of conductive strips;

the at least one functional unit being a plurality of functional units;

the plurality of functional units being arranged into a grid configuration;

the flexible water-impermeable envelop of each of the plurality of functional units being foldably connected amongst each other; and the flexible power-source layer of each of the plurality of functional units being electrically connected amongst each other by a corresponding strip from the plurality of conductive strips.

* * * * *